(12) United States Patent
Lim et al.

(10) Patent No.: US 7,671,400 B2
(45) Date of Patent: Mar. 2, 2010

(54) SEMICONDUCTOR MEMORY DEVICE INCLUDING DOUBLE SPACERS ON SIDEWALL OF FLATING GATE, ELECTRONIC DEVICE INCLUDING THE SAME

(75) Inventors: Joon-Sung Lim, Seoul (KR); Jong-Ho Park, Seoul (KR); Hyun-Chul Back, Gyeonggi-do (KR); Sung-Hun Lee, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 78 days.

(21) Appl. No.: 12/133,587

(22) Filed: Jun. 5, 2008

(65) Prior Publication Data

US 2009/0096005 A1    Apr. 16, 2009

(30) Foreign Application Priority Data

Oct. 15, 2007    (KR) .................... 10-2007-0103708

(51) Int. Cl.
*H01L 29/788*    (2006.01)
(52) U.S. Cl. .................. 257/316; 257/317; 257/321; 257/E21.422; 257/E29.3
(58) Field of Classification Search ............. 257/316, 257/317, 321, E21.422, E29.3
See application file for complete search history.

(56) References Cited

FOREIGN PATENT DOCUMENTS

| JP | 2005-079165 | 3/2005 |
|----|-------------|--------|
| KR | 2007-0000148 | 1/2007 |
| KR | 2007-0036960 | 4/2007 |

OTHER PUBLICATIONS

English language abstract of Japanese Publication No. 2005-079165.
English language abstract of Korean Publication No. 2007-0000148.
English language abstract of Korean Publication No. 2007-0036960.

*Primary Examiner*—Thien F Tran
(74) *Attorney, Agent, or Firm*—Muir Patent Consulting, PLLC (57) ABSTRACT

A semiconductor memory device includes a device isolation layer formed in a semiconductor substrate to define a plurality of active regions. Floating gates are disposed on the active regions. A control gate line overlaps top surfaces of the floating gates and crosses over the active regions. The control gate line has an extending portion disposed in a gap between adjacent floating gates and overlapping sidewalls of the adjacent floating gates. First spacers are disposed on the sidewalls of the adjacent floating gates. Each of the first spacers extends along a sidewall of the active region and along a sidewall of the device isolation layer. Second spacers are disposed between outer sidewalls of the first spacers and the extending portion and are disposed above the device isolation layer. An electronic device including a semiconductor memory device and a method of fabricating a semiconductor memory device are also disclosed.

12 Claims, 10 Drawing Sheets

SEMICONDUCTOR MEMORY DEVICE INCLUDING DOUBLE SPACERS ON SIDEWALL OF FLATING GATE, ELECTRONIC DEVICE INCLUDING THE SAME

CROSS-REFERENCE TO RELATED PATENT APPLICATION

This application claims the benefit of foreign priority to Korean Patent Application No. 10-2007-0103708, filed on Oct. 15, 2007, the disclosure of which is incorporated herein in its entirety by reference.

BACKGROUND

1. Field of Invention

Embodiments of the present invention relate generally to semiconductor memory devices, and more particularly, to a semiconductor memory device such as a nonvolatile memory device.

2. Description of the Related Art

Semiconductor memory devices, which store data, are generally classified as volatile memory devices or nonvolatile memory devices. Volatile memory devices lose stored data in the event of power interruption, whereas nonvolatile memory devices retain stored data even if power is interrupted.

A flash memory device is a type of nonvolatile memory device that is capable of electrically writing and erasing data, and is suitable for high density and high capacitance. A unit cell of the flash memory device may include a stack gate structure in which a floating gate and a control gate are sequentially stacked on an active region. A capacitive coupling may exist between the floating gates of unit cells adjacent to each other along the direction in which the control gate extends. This capacitive coupling may cause a read error in an operation mode for selectively reading data stored in a unit cell.

SUMMARY

Embodiments of the present invention can be generally characterized as capable of providing a semiconductor memory device such as a nonvolatile memory device that can remove a read error. Embodiments of the present invention can also be generally characterized as capable of providing an electronic device having a semiconductor memory device such as a nonvolatile memory device that can remove a read error.

One example embodiment of the present invention can be generally characterized as a semiconductor memory device that includes: a device isolation layer formed in a semiconductor substrate to define a plurality of active regions; floating gates disposed on the active regions; a control gate line overlapping top surfaces of the floating gates and crossing over the active regions, the control gate line having an extending portion disposed in a gap between adjacent ones of the floating gates, the extending portion overlapping sidewalls of the adjacent ones of the floating gates; first spacers disposed on sidewalls of the adjacent ones of the floating gates, wherein each of the first spacers extends along a sidewall of the active region and along a sidewall of the device isolation layer; and second spacers disposed between outer sidewalls of the first spacers and the extending portion of the control gate line, wherein each of the second spacers is disposed above the device isolation layer.

Another example embodiment of the present invention can be generally characterized as an electronic device that includes: a semiconductor memory device; and a controller electrically connected to the nonvolatile memory device. The semiconductor memory device may include: a device isolation layer formed in a semiconductor substrate to define a plurality of active regions; floating gates disposed on the active regions; a control gate line overlapping top surfaces of the floating gates and crossing over the active regions, the control gate line having an extending portion disposed in a gap between adjacent ones of the floating gates, the extending portion overlapping sidewalls of the adjacent ones of the floating gates; first spacers disposed on sidewalls of the sidewalls of the adjacent ones of the floating gates, wherein each of the first spacers extends along a sidewall of the active region and along a sidewall of the device isolation layer; and second spacers disposed between outer sidewalls of the first spacers and the extending portion of the control gate line, wherein each of the second spacers is disposed above the device isolation layer.

BRIEF DESCRIPTION OF THE DRAWINGS

The above and other embodiments of the present invention will become more apparent with reference to the attached drawings in which.

DETAILED DESCRIPTION

Reference will now be made in detail to the accompanying drawings, which illustrate example embodiments of the present invention. However, the example embodiments are not limited to the illustrations provided by the drawings and detailed description thereof. Rather, the drawings and accompanying detailed description are introduced to provide easy and complete understanding of the scope and spirit of example embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
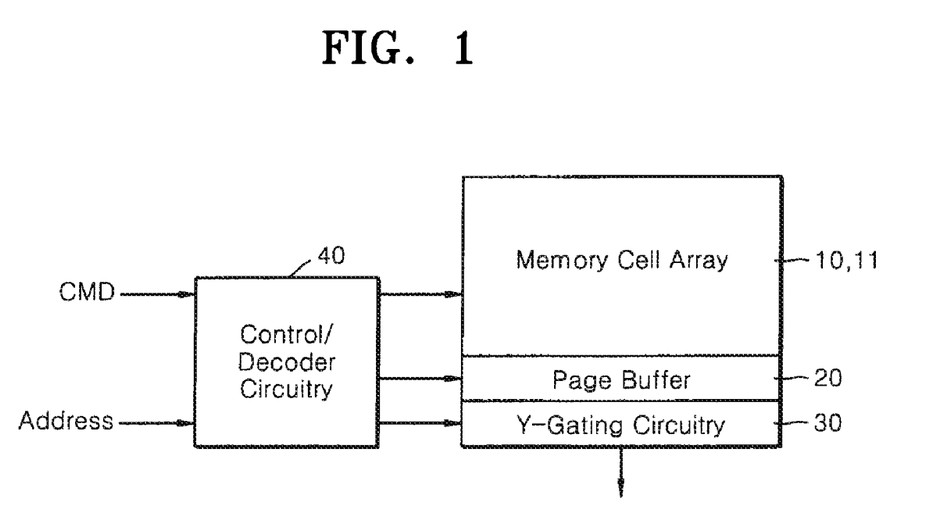
FIG. 1 is a block diagram of a semiconductor memory according to an embodiment of the present invention.

FIG. 1 is a block diagram of a semiconductor memory according to an embodiment of the present invention.

Referring to FIG. 1, a nonvolatile memory may include a memory cell array 10, 11, a page buffer 20, a Y-gating circuitry 30, and a control/decoder circuitry 40.

The memory cell array 10, 11 may include a plurality of memory blocks, and each of the plurality of memory blocks may include a plurality of nonvolatile memory cells. The nonvolatile memory cells may be provided as flash memory cells (e.g., NAND flash memory cells or NOR flash memory cells). The page buffer 20 can temporarily store data to be written in the memory cell array 10, 11, or data to be read from the memory cell array 10, 11. The Y-gating circuitry 30 can transmit data stored in the page buffer 20. The control/decoder circuitry 40 can receive a command and an address from an external device, output a control signal to write data in the memory cell array 10, 11 to read data from the memory cell array 10, 11 and decode the address. The control/decoder circuitry 40 can output a control signal for input and output of data to the page buffer 20 and provide address information to the Y-gating circuitry 30.

Figure 2:
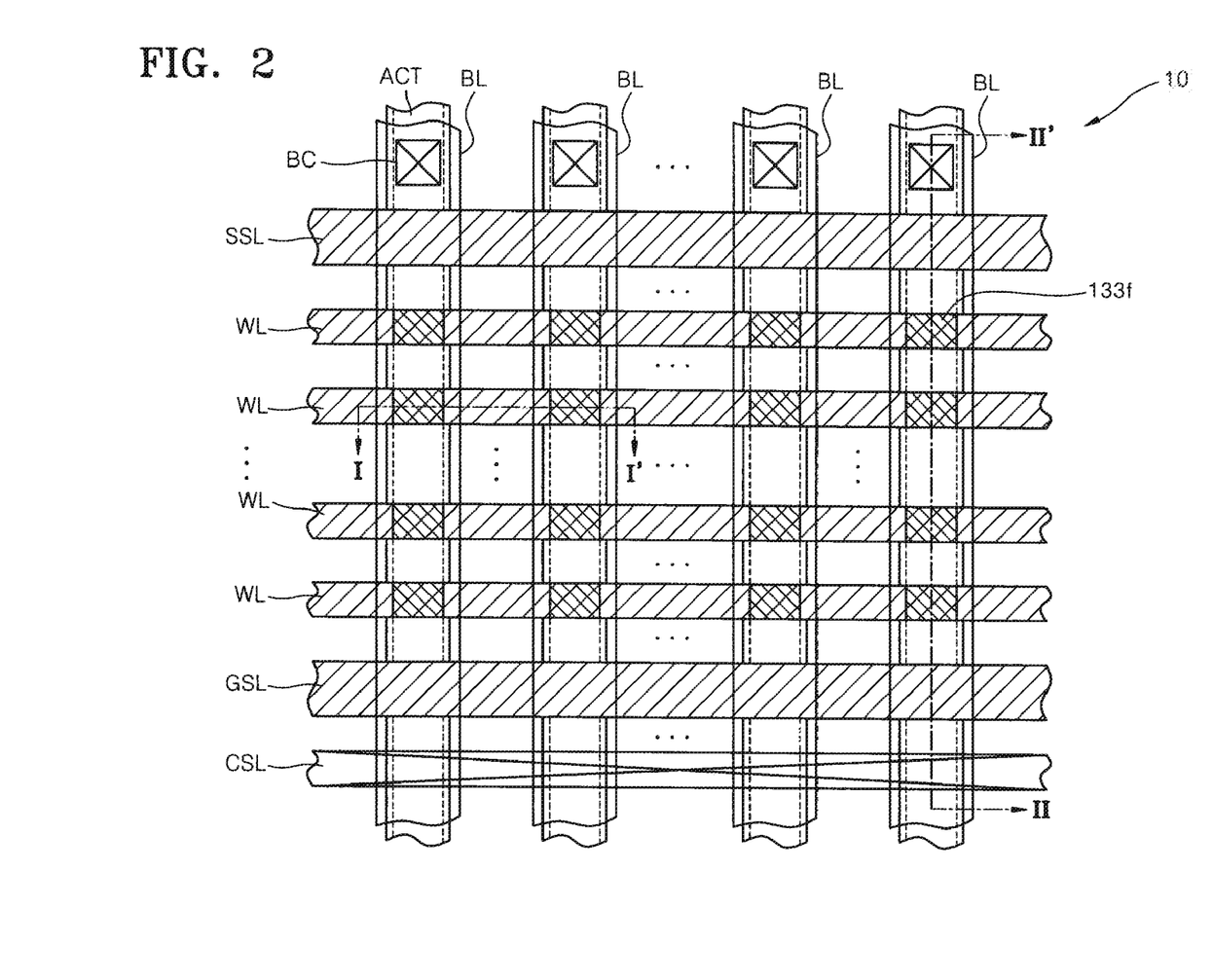
FIG. 2 illustrates a layout of a portion of a memory cell array of a semiconductor memory according to an embodiment of the present invention.
Figure 3A:
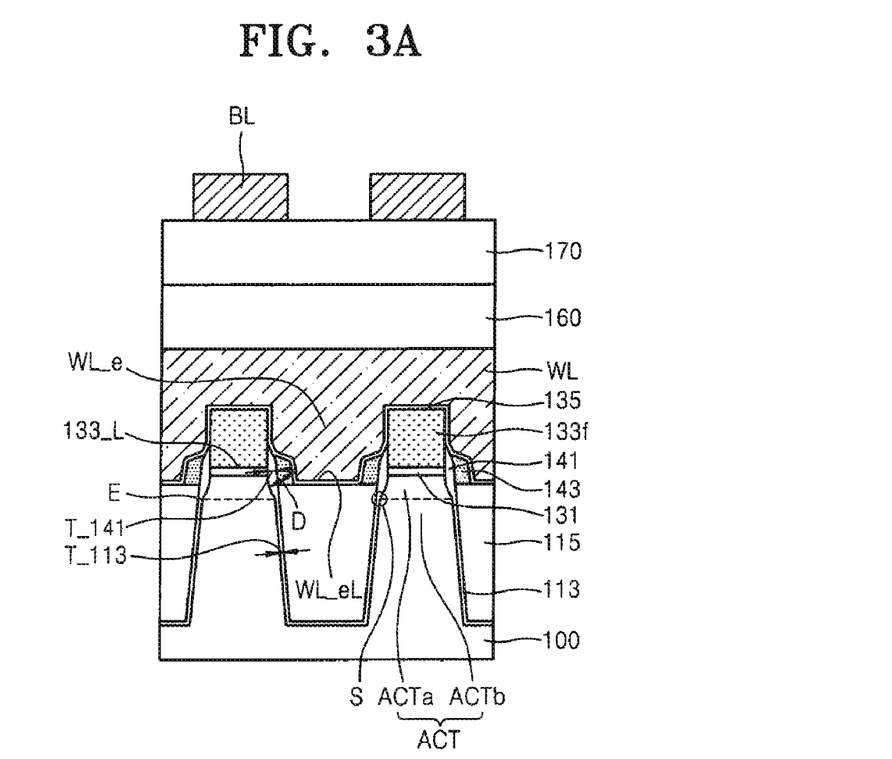
FIGS. 3A and 3B are cross-sectional views taken along lines I-I' and II-II' of FIG. 2, respectively.
Figure 3B:
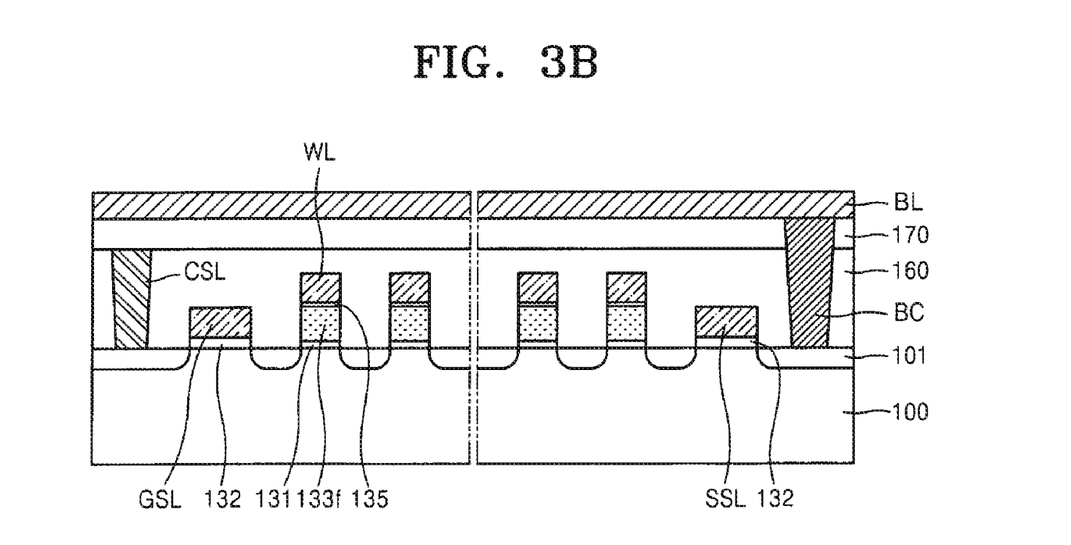

FIG. 2 illustrates the layout of a portion of a memory cell array of a semiconductor memory according to an embodiment of the present invention. The portion of the memory cell array shown in FIG. 2 may be a portion of the memory cell array 10 in FIG. 1. The memory cell array 10 in the embodiment shown in FIG. 2 may be a NAND flash memory. FIGS. 3A and 3B are cross-sectional views taken along lines I-I' and II-II' of FIG. 2, respectively.

Referring to FIGS. 2, 3A and 3B, the memory cell array 10 may include a plurality of active regions ACT defined by a device isolation layer 115 formed in a semiconductor substrate 100. The device isolation layer 115 may fill trenches formed in the semiconductor substrate 100. The active regions ACT may have a line configuration in which adjacent active regions ACT are substantially parallel to each other.

A string selection line SSL and a ground selection line GSL may cross over the active regions ACT. A gate insulating layer 132 is interposed between the string selection line SSL and the active regions ACT and between the ground selection line GSL and the active regions ACT. A plurality of control gate lines WL crossing over the top of the active regions ACT may be disposed between the string selection line SSL and the ground selection line GSL. The string selection line SSL, the ground selection line GSL, and the control gate lines WL may be substantially parallel to one another.

Impurity regions (e.g., source and drain regions 101) may be formed in the active regions ACT at both sides of the control gate lines WL, the string selection line SSL, and the ground selection line GSL. As a result, a string selection transistor, cell transistors and a ground selection transistor can be connected in series. The string selection transistor, the ground selection transistor, and the cell transistors interposed between the string selection transistor and the ground selection transistor may constitute one unit memory block. The impurity regions 101 disposed adjacent to the string selection line SSL and opposite to the ground selection line GSL may be defined as drain regions of the string selection transistors. Also, impurity regions 101 disposed adjacent to the ground selection line GSL and opposite to the string selection line SSL may be defined as source regions of the ground selection transistors.

A plurality of floating gates 133f are disposed between the active regions ACT and the control gate lines WL. A tunneling insulating layer 131 is interposed between the floating gates 133f and the active regions ACT. The floating gates 133f are arranged along a direction substantially parallel to the active regions ACT (i.e., a along a column direction) and are arranged along a direction substantially parallel to the control gate lines WL (i.e., along a row direction). The control gate lines WL overlap upper surfaces of the floating gates 133f, and have extending portions WL_e arranged along the row direction. The extending portions WL_e are disposed in a gap between the adjacent floating gates 133f. In the illustrated embodiment, a capacitive coupling between floating gates 133f adjacent to each other along the row direction can be decreased due to the presence of the extending portions WL_e. Therefore, even when the floating gates 133f have different electrical potentials, an electric field between the floating gates 133f is shielded so that the electrical potentials of the respective floating gates 133f can be preserved. Accordingly, a read error of the nonvolatile memory device can be decreased. To further decrease the read error, bottom surfaces WL_eL of the extending portions WL_e may be lower than bottom surfaces 133_L of the floating gates. In one embodiment, a top surface of the device isolation layer 115 may be substantially coplanar with, or lower than, top surfaces of the active regions ACT.

Pairs of sidewalls parallel to the control gate line WL, among sidewalls of each of the floating gates 133f, may be overlapped by the extending portions WL_e. In one embodiment, first spacers 141 are disposed on pairs of sidewalls overlapped by the extending portions WL_e. Accordingly, the first spacers 141 are formed on facing sidewalls of adjacent floating gates 133f, wherein the device isolation layer 115 is disposed therebetween. Each of the first spacers 141 extends between the sidewall of the active region ACT and the sidewall of the device isolation layer 115. In one embodiment, second spacers 143 are disposed between outer sidewalls of the first spacers 141 and the extending portions WL_e of the control gate line WL. Accordingly, the second spacers 143 are disposed on the device isolation layer 115.

The first spacer 141 and the second spacer 143 (collectively referred to herein as a "double spacer") are formed on each of the sidewalls of the floating gates 133f. A distance "D" between the active regions ACT and the extending portions WL_e of the control gate line may be increased due to the presence of the double spacers. Accordingly, even when a maximum voltage is repetitively applied between the control gate line WL and the active region ACT in a data program operation and/or a data erase operation of a NAND flash memory device, a leakage current can be effectively suppressed from being generated between the control gate line WL and the active region ACT. Also, a distance between the floating gates 133f adjacent to each other along the row direction may be increased due to the presence of the double spacers. In this case, a read error of the nonvolatile memory device may be further decreased.

In one embodiment, the second spacers 143 include a material such as silicon nitride. Accordingly, a leakage current can be further suppressed from being generated between the control gate line WL and the active region ACT. The first spacers 141 may include a material such as thermal oxide. A thickness T_141 of the first spacers 141 may be less than half of a width of the active region ACT.

The first spacers 141 may be formed only on the sidewalls of the floating gates 133f and on sidewalls of upper portions ACTa of the active regions ACT. Bottom surfaces of the first spacers 141 may be lower than a channel formed deeper than (i.e., below) the floating gates 133f during device operation and shallower than (i.e., above a bottom portion of) the source/drain region 101. The outer sidewalls of the first spacers 141 may be substantially parallel with the sidewalls of the lower portions ACTb. In the illustrated embodiment, a width of the upper portions ACTa of the active regions ACT is smaller than a width of the lower portions ACTb of the active regions ACT. As a result, a step "S" may be formed between the upper portion ACTa and the lower portion ACTb of each of the active regions ACT. In one embodiment, the width of the upper portions ACTa of the active regions ACT may be substantially the same as a width of the floating gates 133f. A width of the step S between the upper portion ACTa and the lower portion ACTb may be the substantially same as the thickness T_141 of the first spacer 141.

In one embodiment, an oxide liner 113 surrounding the device isolation layer 115 may be formed on the sidewalls of the lower portions ACTb of the active regions ACT. The oxide liner 113 may, for example, include a thermal oxide layer formed by thermally oxidizing the lower portions ACTb of the active region ACT. A thickness T_113 of the oxide liner 113 may be smaller than the thickness T_141 of the first spacer 141. When the oxide liner 113 is formed, an upper edge "E" of the lower portion ACTb of the active region ACT (i.e. an outer edge of the step S) may be rounded. In another embodiment, however, the oxide liner 113 need not be formed but the upper edge E of the lower portion ACTb of the active region may still be rounded. In this case, a voltage applied to the active region ACT can be prevented from being concentrated at the upper edge E, thereby suppressing the generation of a leakage current between the control gate line WL and the active region ACT.

A gate interlayer dielectric layer 135 is interposed between the floating gates 133f and the control gate line WL. The gate interlayer dielectric layer 135 is also interposed between the device isolation layer 115 and the control gate line WL and between the first and second spacers 141 and 143 and the control gate line WL.

A first interlayer insulating layer 160 covering the control gate lines WL and the selection lines SSL and GSL is provided. A common source line CSL penetrating the first interlayer insulating layer 160 and contacting the source region 101 of the ground selection line GSL is provided. The common source line CSL may be formed in parallel with the ground selection line GSL.

A second interlayer insulating layer 170 may be provided on the first interlayer insulating layer 160. A bit line plug BC penetrating the second interlayer insulating layer 170 and the first interlayer insulating layer 160 and contacting the drain region 101 of the SSL may be provided. Bit lines BL contacting the bit line plug BC and crossing over the top surfaces of the control gate lines WL may be disposed on the second interlayer insulating layer 170. The bit lines BL may be arranged substantially parallel to the active regions ACT.

Figure 4:
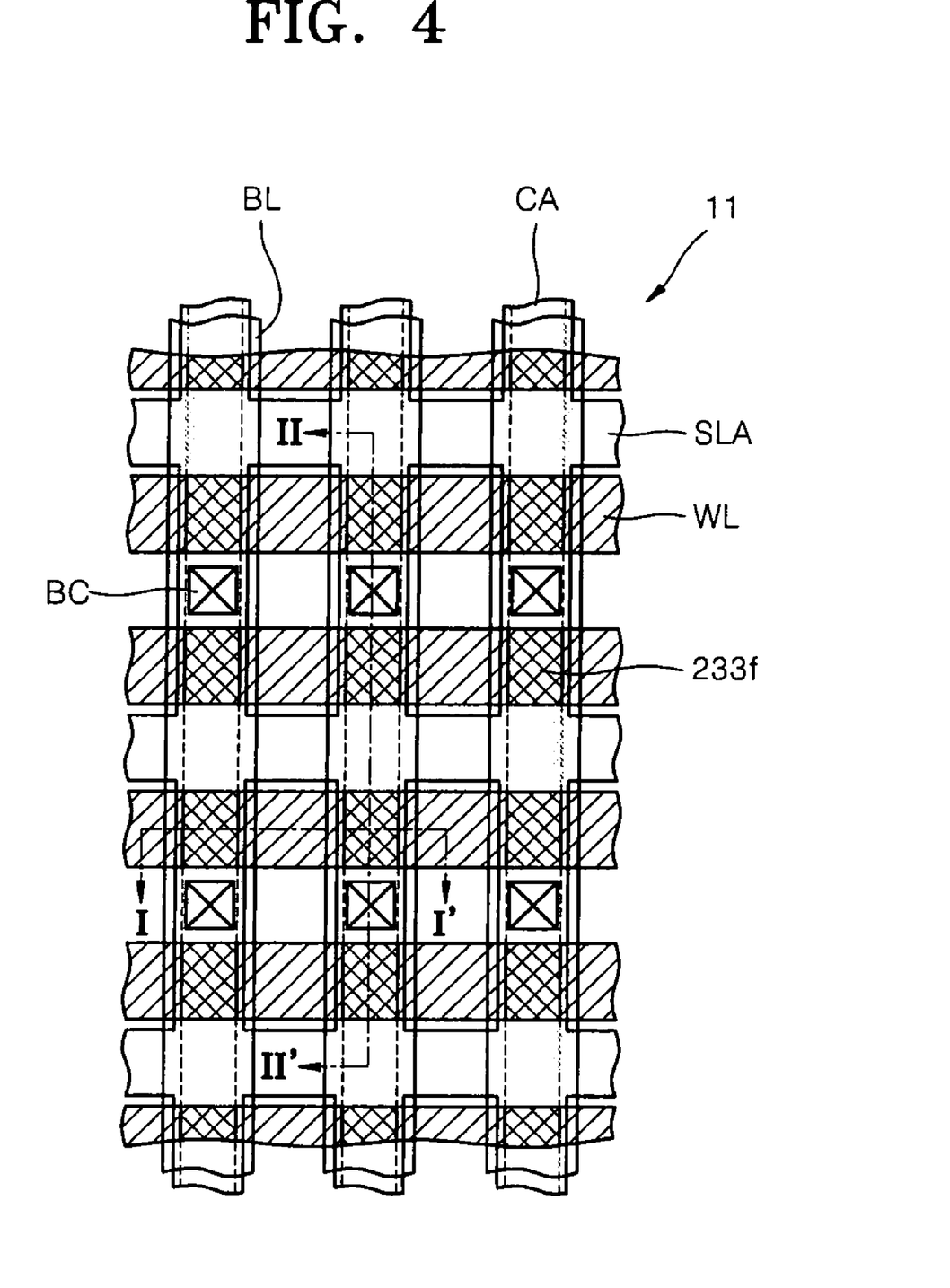
FIG. 4 illustrates a layout of a portion of a memory cell array of a semiconductor memory according to another embodiment of the present invention.
Figure 5A:
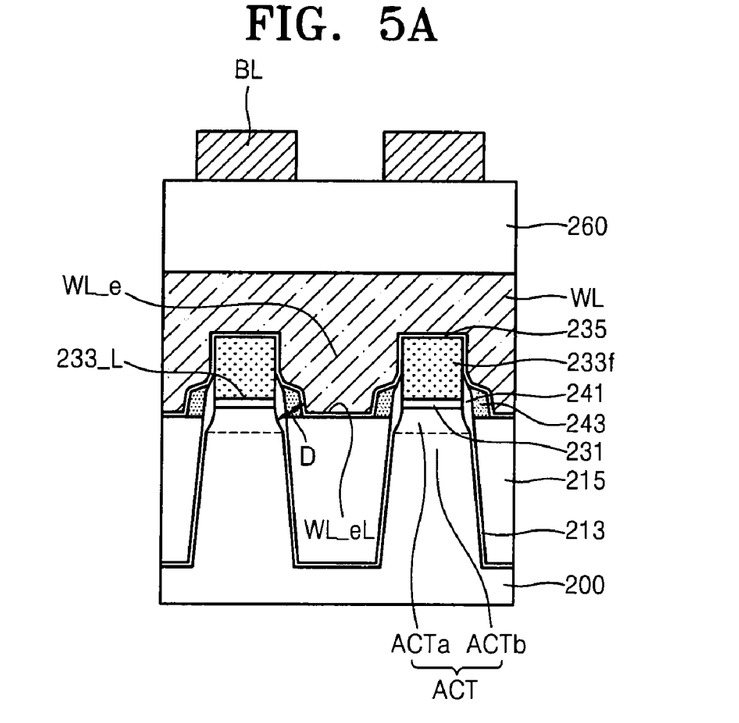
FIGS. 5A and 5B are cross-sectional views taken along lines I-I' and II-II' of FIG. 4, respectively.
Figure 5B:
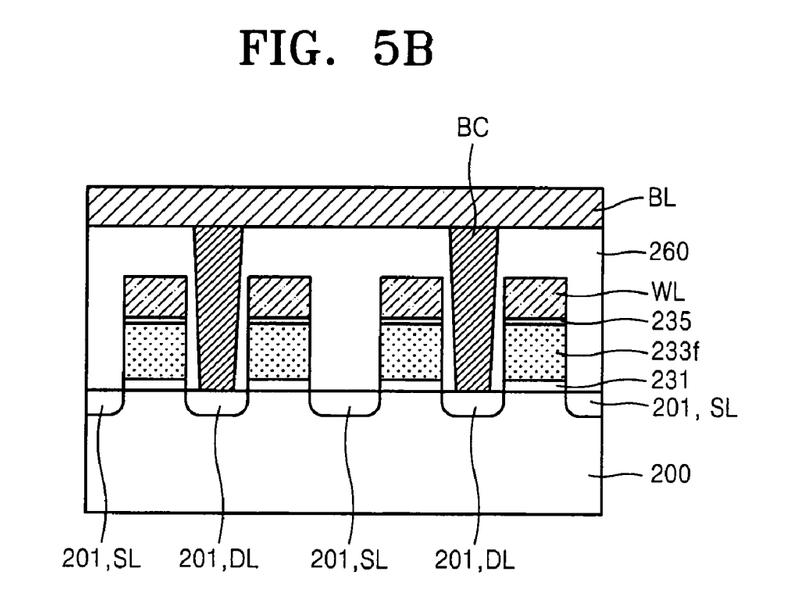

FIG. 4 illustrates a layout of a portion of a memory cell array of a semiconductor memory according to another embodiment of the present invention, and may be a layout showing a portion of the memory cell array 10 described with reference to FIG. 1. The memory cell array in the embodiment shown in FIG. 4 may be a NOR flash memory. FIGS. 5A and 5B are cross-sectional views taken along lines I-I' and II-II' of FIG. 4, respectively.

Referring to FIGS. 4, 5A and 5B, a memory cell array 11 may include active regions ACT defined by a device isolation layer 215 formed in a semiconductor substrate 200. The active regions ACT may include a plurality of common source line active regions SLA substantially parallel to each other and a plurality of cell active regions CA crossing the common source line active regions SLA.

A pair of control gate lines WL spaced apart from each other are arranged on the respective cell active regions CA. The control gate lines WL are arranged adjacent to corresponding ones of the common source line active regions SLA. Impurity regions (e.g., source and drain regions 201) may be formed in the cell active region CA and the common source line active region SLA exposed between pairs of control gate lines WL. As a result, a pair of cell transistors may be defined on each of the cell active regions CA. The impurity region 201 formed within the cell active region CA may be defined as a drain region DL, and the impurity region formed within the common source line active region SLA may be defined as a common source region SL.

A plurality of floating gates 233f are disposed between the cell active regions CA and the control gate lines WL. A tunneling insulating layer 231 is interposed between the floating gates 233f and the cell active regions CA. The floating gates 233f are arranged along a direction substantially parallel to the cell active regions CA (i.e., along a column direction) and are arranged along a direction substantially parallel to the control gate lines WL (i.e., along a row direction). The control gate lines WL overlap upper surfaces of the floating gates 233f, and have extending portions WL_e disposed in a gap between floating gates 233f adjacent to each other along the row direction.

Pairs of sidewalls parallel to the control gate line WL, among sidewalls of the floating gates 233f, may be overlapped by the extending portions WL_e. In one embodiment, first spacers 241 are disposed on pairs of the sidewalls overlapped by the extending portions WL_e. In one embodiment, second spacers 243 are disposed on outer sidewalls of the first spacers 241. The second spacers 243 are disposed on the device isolation layer 215. A distance "D" between the cell active regions CA and the extending portions WL_e of the control gate line may be increased due to the presence of the first and second spacers 241 and 243. Accordingly, even when a maximum voltage is repetitively applied between the control gate line WL and the cell active region CA in a data erase operation of a NOR flash memory device, a leakage current can be prevented from being generated between the control gate line WL and the cell active region CA.

In one embodiment, an oxide liner 213 surrounding the device isolation layer 215 may be formed on sidewalls of lower portions ACTb of the active regions ACT. A gate interlayer dielectric layer 235 is interposed between the floating gates 233f and the control gate line WL. The gate interlayer dielectric layer 235 is also interposed between the device isolation layer 215 and the control gate line WL and between the first and second spacers 241 and 243 and the control gate line WL.

The tunneling insulating layer 231, the floating gates 233 f, the first spacers 241, the second spacers 243, the gate interlayer dielectric layer 235 and the control gate line WL may be similar to the tunneling insulating layer 131, the floating gates 133f, the first spacers 141, the second spacers 143, the gate interlayer dielectric layer 135 and the control gate line WL, respectively, as exemplarily described with reference to FIGS. 2, 3A and 3B.

An interlayer insulating layer 260 covering the control gate lines WL may be provided. A bit line plug BC penetrating the interlayer insulating layer 260 and contacting the drain region DL may be provided. Bit lines BL contacting the bit line plug BC and crossing over the top surfaces of the control gate lines WL may be disposed on the interlayer insulating layer 260. The bit lines BL may be arranged substantially parallel to the cell active regions CA.

FIGS. 6A through 6G are cross-sectional views illustrating a method of fabricating a semiconductor memory device according to an embodiment of the present invention, taken along line I-I' of FIG. 2 or line I-I' of FIG. 4 in each process step.

Figure 6A:
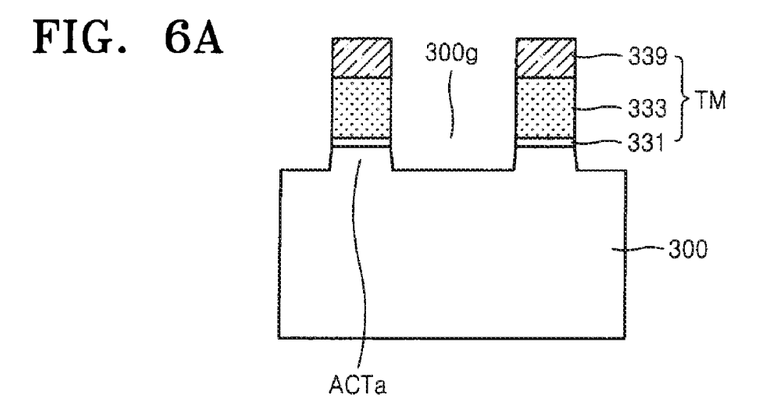
FIGS. 6A through 6G are cross-sectional views illustrating a method of fabricating a semiconductor memory device according to an embodiment of the present invention.

Referring to FIG. 6A, a tunneling insulating layer 331 may be formed on a semiconductor substrate 300. The semiconductor substrate 300 may, for example, include a silicon substrate. The tunneling insulating layer may, for example, include a material such as silicon oxide. In one embodiment, the tunneling insulating layer 331 may be formed using a thermal oxidation process, and be formed having a thickness in a range of about 20 Å to about 100 Å. A floating gate conductive layer is formed on the tunneling insulating layer 331. The floating gate conductive layer may, for example, include a material such as polysilicon and be formed having a thickness in a range of about 500 Å to about 1500 Å. A hard mask layer may be formed on the floating gate conductive layer. The hard mask layer may, for example, include a material such as silicon oxide, silicon nitride, or a combination thereof.

The hard mask layer, the floating gate conductive layer and the tunneling insulating layer 331 may be sequentially patterned to form trench mask patterns TM exposing predetermined regions of the semiconductor substrate 300. Each of the trench mask patterns TM may include the tunneling insulating layer 331, a floating gate pattern 333 and a hard mask pattern 339. In one embodiment, a width of the trench mask patterns TM (e.g., a width of the floating gate patterns 333) or a width of a gap between the floating gate patterns 333 may be limited by a resolution limitation of a photolithography process.

An upper region of the semiconductor substrate 300 is etched using the trench mask patterns TM as an etch mask. As a result, a groove 300g defining upper portions ACTa of the active regions ACT is formed in an upper region of the semiconductor substrate 300. A width of the upper portions ACTa of the active regions ACT may be substantially the same as a width of the floating gate patterns 333.

Figure 6B:
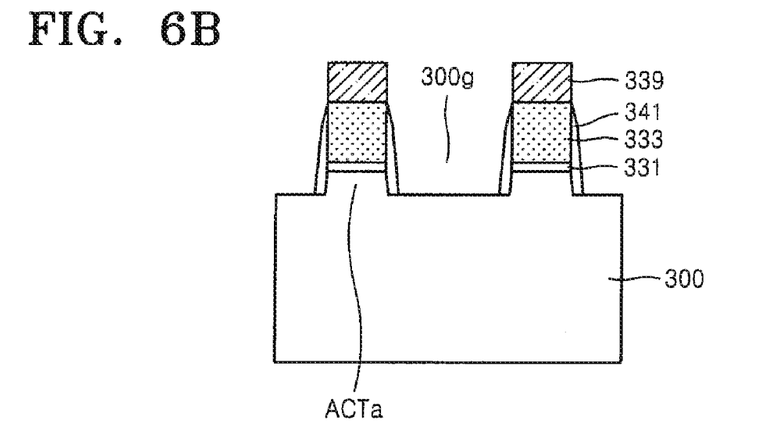

Referring to FIG. 6B, first spacers 341 are formed on sidewalls of the floating gate patterns 333 and on sidewalls of the upper portions ACTa of the active regions ACT. For example, a material such as thermal oxide may be formed on the sidewalls of the floating gate patterns 333, the sidewalls of the upper portions ACTa of the active regions ACT, and a bottom of the groove 300g by thermally oxidizing the semiconductor substrate 300 having the groove 300g. Thereafter, the thermal oxide material may be anisotropically etched to form the first spacers 341. In the illustrated embodiment, since the thermal oxide layer is formed by thermally oxidizing the semiconductor substrate 300 having the groove 300g, the sidewalls of the floating gate patterns 333 and the sidewalls of the upper portions ACTa of the active regions ACT are partially consumed. Accordingly, it is possible to further decrease the width of the floating gate patterns 333 having the limited width due to the resolution limitation of the photolithography process and the width of the upper portion ACTa of the active regions. As a result, the width of the gap region between adjacent ones of the floating gate patterns 333 may be increased.

Figure 6C:
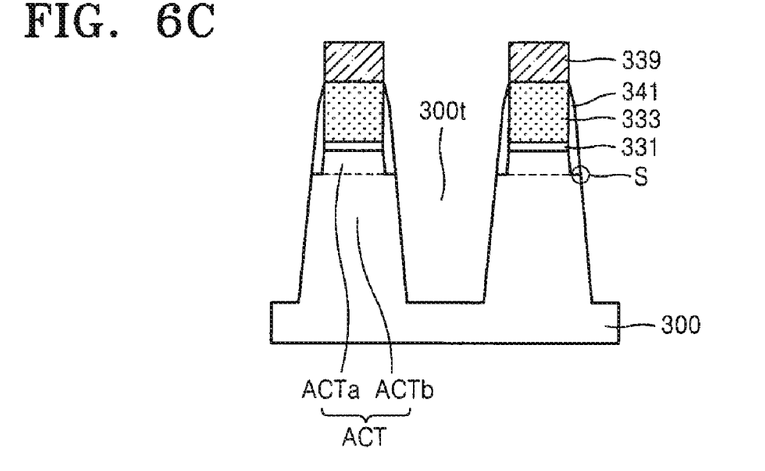

Referring to FIG. 6C, a portion of the semiconductor substrate 300 between the first spacers 341 is further etched to form a trench 300t, connected with the groove 300g. In this process, the first spacers 341 function as an etch mask to protect the sidewalls of the floating gate patterns 333 and to prevent the sidewalls of the floating gate patterns 333 from being etch-damaged. The trench 300t defines lower portions ACTb of the active regions ACT. A width of each of the lower portions ACTb of the active regions ACT may be substantially the same as a sum of a width of each of the floating gate patterns 333 and widths of the one pair of spacers 341 formed on both sidewalls of one floating gate pattern 333. Because, the width of the upper portions ACTa of the active regions ACT is less than the width of the lower portions ACTb of the active regions, steps "S" may be formed between the upper portions ACTa and the lower portions ACTb of each of the active regions ACT. The groove 300g and the trench 300t define the active region ACT, including the upper portion ACTa and the lower portion ACTb.

As shown in FIG. 6C, the trenches 300t may have positively sloped sidewalls. In other words, a width of an upper portion of a trench 300t may be greater than a width of a lower portion of the trench 300t. Accordingly, outer sidewalls of the first spacers 341 disposed at an upper portion of the trenches 300t may have a positive slope.

Figure 6D:
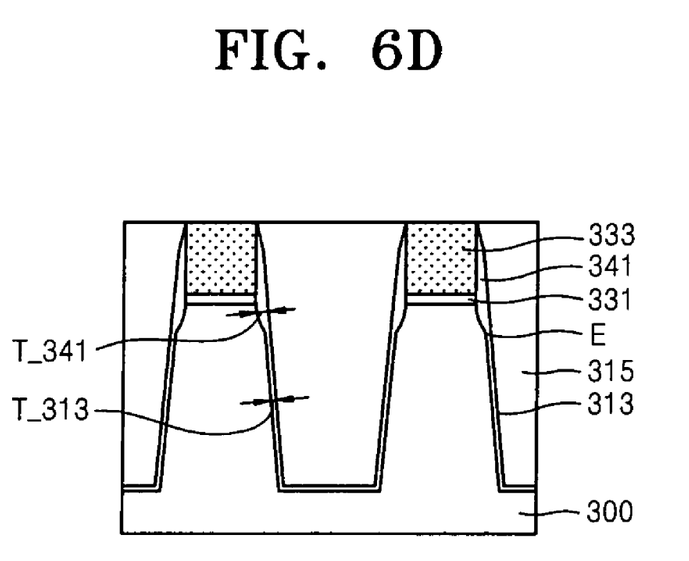

Referring to FIG. 6D, an etch damage may be cured by curing the sidewalls of the lower portion ACTb of the active region and bottoms of the trenches 300t. In this case, upper edges E of the lower portion ACTb of the active region may be rounded. The aforementioned curing may be performed using, for example, a thermal oxidation technique or an $N_2$ plasma process technique. When curing using the thermal oxidation technique, an oxide liner 313 may be formed on the sidewalls of the lower portions ACTb of the active regions and the bottoms of the trenches 300t. A thickness T_313 of the oxide liner 313 may be less than a thickness T_341 of the first spacers 341.

A buried insulating layer filling the trenches 300t is formed on the semiconductor substrate 300 having the trenches 300t, and is then planarized until the floating gate patterns 333 are exposed. As a result, a device isolation layer 315 is formed in the trenches 300t. The hard mask patterns 339 may be removed during the planarizing process. The planarizing process may be performed using a chemical mechanical polishing (CMP), an etch-back process, or the like or a combination thereof. The buried insulating layer may, for example, include a high density plasma-chemical vapor deposition (HDP-CVD) oxide, an undoped silica glass (USG), or the like or a combination thereof.

When forming the buried insulating layer, the buried insulating layer can fill the trenches 300t without a void due to the positive slope of the sidewalls of the trenches 300t and the positive slope of the outer sidewalls of the first spacers 341 disposed on the trenches 300t.

Figure 6E:
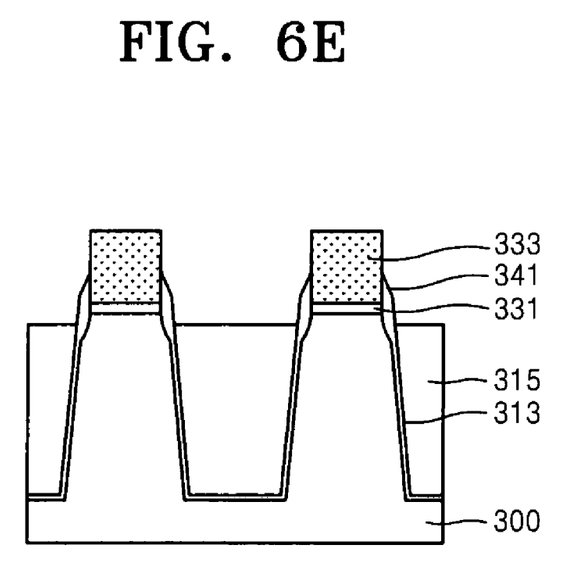

Referring to FIG. 6E, the device isolation layer 315 is selectively etched using the floating gate patterns 333 as an etch mask to recess the device isolation layer 315. A top surface of the recessed device isolation layer 315 may be substantially coplanar with or lower than top surfaces of the active regions ACT. Upper regions of the first spacers 341 may be exposed above the top surface of the recessed device isolation layer 315.

The selective etching of the device isolation layer 315 may be performed using a wet etch. In one embodiment, the first spacers 341 formed of a thermal oxide are barely etched. The wet etch may be performed using an etchant such as an HF solution, an $H_2SO_4$ solution, a mixed solution (SC-1 solution) of $NH_4OH$ and $H_2O_2$, a mixed solution (LAL solution) of $NH_4F$ and HF, or the like or a combination thereof.

Figure 6F:
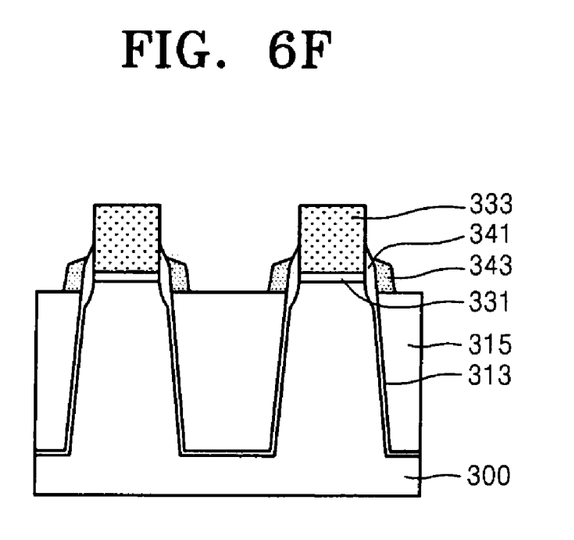

Referring to FIG. 6F, second spacers 343 are formed on upper regions of the first spacers 341 exposed above the device isolation layer 315. The second spacers 343 may be formed, for example, by forming an insulating layer on the floating gate patterns 333, the first spacers 341 and the device isolation layer 315 and then anisotropically etching the insulating layer. The second spacers 343 may, for example, include a material such as silicon nitride.

Figure 6G:
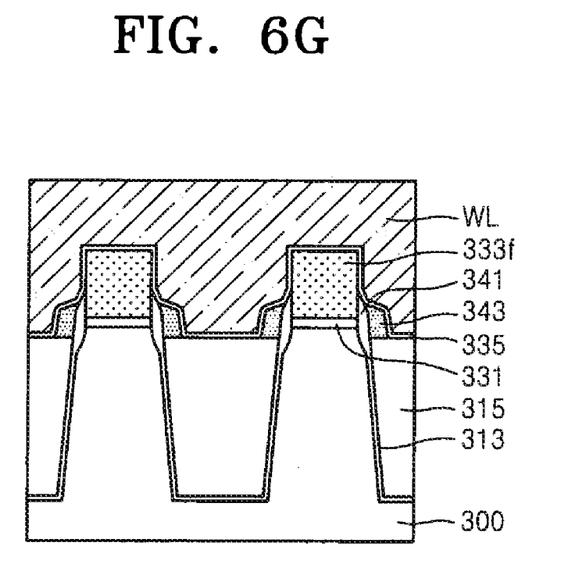

Referring to FIG. 6G, a gate interlayer dielectric layer 335 and a control gate conductive layer are sequentially formed on the semiconductor substrate on which the second spacers 343 are formed. The control gate conductive layer, the gate interlayer dielectric layer 335 and the floating gate patterns 333 are then sequentially patterned to form a control gate line WL crossing over the active regions. At the same time with the forming of the control gate line WL, floating gates 333f interposed between the control gate line WL and the active regions ACT are formed. The gate interlayer dielectric layer 335 may, for example, include at least one dielectric material selected from the group consisting of layered oxide/nitride/oxide (O/N/O), aluminum oxide ($Al_2O_3$), hafnium oxide ($HFO_2$), layered hafnium oxide ($HFO_2$)/aluminum oxide ($Al_2O_3$), layered silicon oxide ($SiO_2$) layer/hafnium oxide ($HFO_2$)/aluminum oxide ($Al_2O_3$), or the like. The control gate conductive layer may, for example, include a material such as doped polysilicon, polycide or a combination thereof.

Figure 7A:
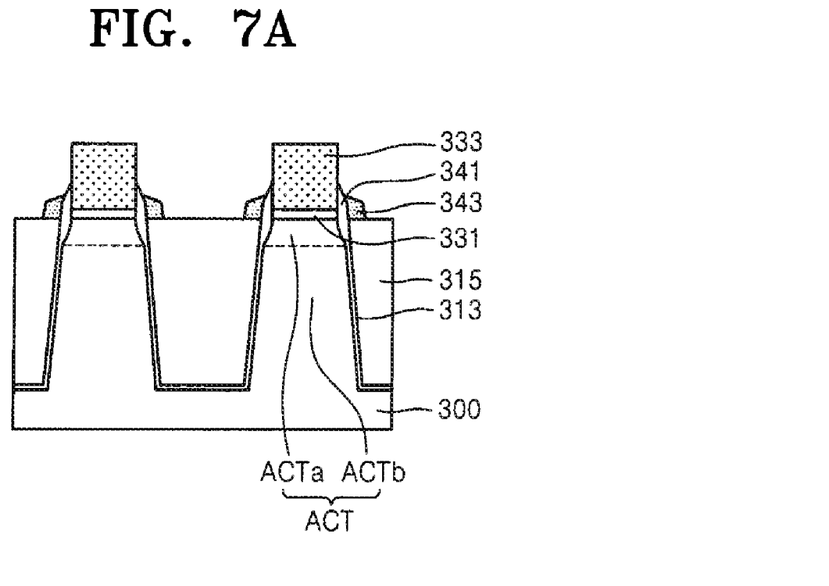
FIGS. 7A and 7B are cross-sectional views illustrating a method of fabricating a semiconductor memory device according to another embodiment of the present invention.
Figure 7B:
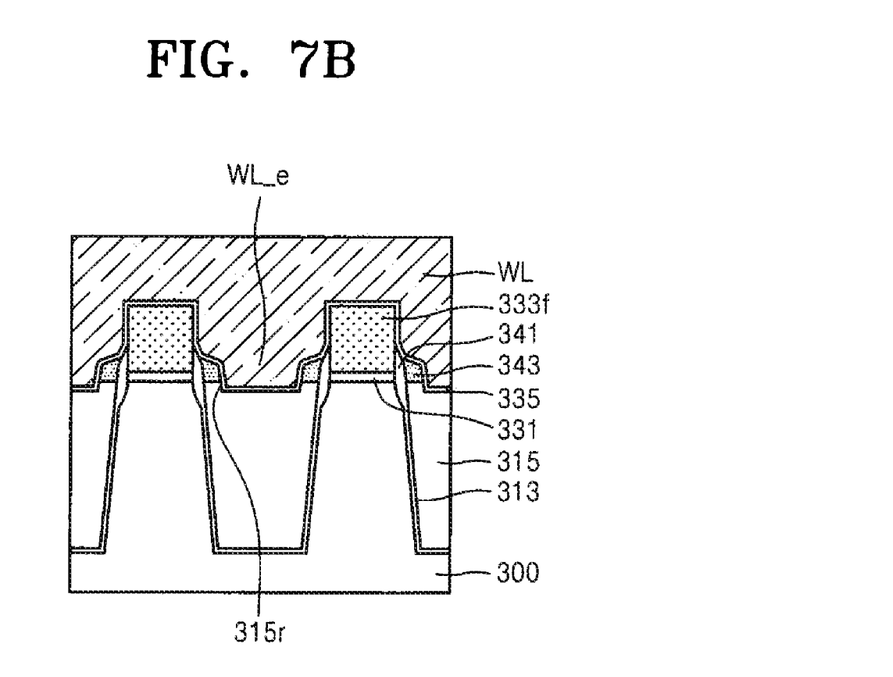

FIGS. 7A and 7B are cross-sectional views for illustrating a method of fabricating a semiconductor memory device according to another embodiment of the present invention. The method of fabricating a semiconductor memory device according to the present embodiment is similar to the method of fabricating the semiconductor memory device described with reference to FIGS. 6A through 6G, except for the following description.

Referring to FIG. 7A, after forming the structure shown in FIG. 6D, the device isolation layer 315 is selectively etched using the floating gate patterns 333 as an etch mask to recess the device isolation layer 315. A top surface of the recessed device isolation layer 315 may be substantially coplanar with or higher than top surfaces of the active regions ACT. Upper regions of the first spacers 341 may be exposed above the recessed device isolation layer 315. The selective etch of the device isolation layer 315 may be performed using a wet etch.

Second spacers 343 are formed on upper regions of the first spacers 341 exposed above the device isolation layer 315. The second spacers 343 may, for example, include a material such as silicon nitride.

Referring to FIG. 7B, the portion of the device isolation layer 315 between the second spacers 343 is etched to form a recess portion 315r in an upper region of the device isolation layer 315. A bottom surface of the recess portion 315 may be substantially coplanar with or lower than top surfaces of the active regions ACT. A gate interlayer dielectric layer 335 and a control gate conductive layer are sequentially formed on the semiconductor substrate on which the recess portion 315r is formed. The control gate conductive layer, the gate interlayer dielectric layer 335 and the floating gate patterns 333 are sequentially patterned to form a control gate line WL crossing over the active regions. At the same time with the forming of the control gate line WL, floating gates 333f interposed between the control gate line WL and the active regions ACT are formed. The control gate line WL has an extending portion WL_e filling a gap between the adjacent ones of the floating gates 333f, and the extending portion WL_e is disposed within the recess portion 315r.

Figure 8:
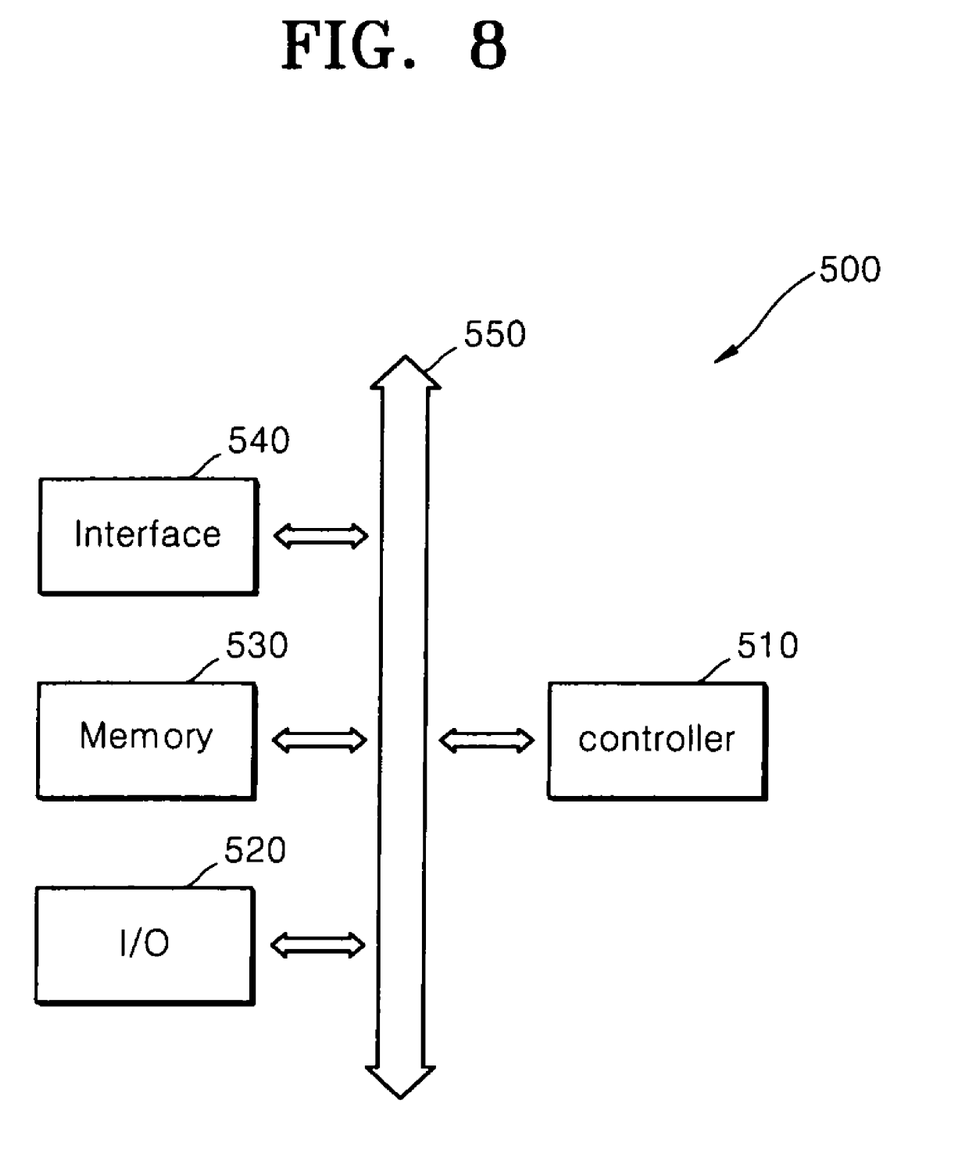
FIG. 8 is a schematic view illustrating a system including a semiconductor memory according to embodiments of the present invention.

FIG. 8 is a schematic view for illustrating a system including a semiconductor memory according to embodiments of the present invention.

Referring to FIG. 8, a system 500 may include a controller 510, an I/O device 520, a memory 530 and an interface 540. The system 500 may be a mobile system or a system transmitting or receiving information, or the like. The mobile system may be a personal digital assistant (PDA), a portable computer, a web tablet, a wireless phone, a mobile phone, a digital music player, a memory card, or the like. The controller 510 may be a microprocessor, a digital signal processor, a micorcontroller or a device similar to these devices. The I/O device 520 may be a keypad, a keyboard, or a display. The memory 530 may include a semiconductor memory according to any of the embodiments of the present invention described herein. The interface 540 may be a data transmission path between the system 500 and other external apparatus.

The controller 510, the I/O device 520, the memory 530 and the interface 540 can communicate with each other through a bus 550.

As described above, according to embodiments of the present invention, the extending portion disposed in a gap between adjacent ones of the floating gates can decrease a capacitive coupling between the floating gates to decrease a read error of a nonvolatile memory device. Further, a first spacer and a second spacer (i.e., a "double spacer") can be formed on each of the sidewalls of the floating gates to increase a distance between the active region and the extending portion of the control gate line. Accordingly, even when a maximum voltage is repetitively applied between the control gate line and the active region in a data program operation and/or a data erase operation of a NAND flash memory device, a leakage current can be prevented from being generated between the control gate line and the active region.

Embodiments of the present invention may be practiced in many ways. What follows is a non-limiting discussion of some example embodiments.

According to an embodiment of the present invention, there is provided a nonvolatile memory device. The nonvolatile memory device includes a device isolation layer formed in a semiconductor substrate to define a plurality of active regions. Floating gates are disposed on the active regions. A control gate line overlapping top surfaces of the floating gates and running across the active regions is provided. The control gate line has an extending portion disposed in a gap between the floating gates adjacent to each other. The extending portion overlaps sidewalls of the floating gates adjacent to each other. First spacers are disposed on sidewalls of the floating gates overlapping the control gate line. Each of the first spacers extends between a sidewall of the active region and a sidewall of the device isolation layer. Second spacers are disposed between outer sidewalls of the first spacers and the extending portion of the control gate line. The second spacers are disposed above the device isolation layer.

According to another embodiment of the present invention, there is provided an electronic device having the above nonvolatile memory device.

According to still another embodiment of the present invention, there is provided a method of fabricating a nonvolatile memory device. The method includes: forming floating gate patterns on a semiconductor substrate; etching the semiconductor substrate between the floating gates to form a groove in the semiconductor substrate and define upper portions of active regions; forming first spacers on sidewalls of the floating gate patterns and on sidewalls of the upper portions of the active regions; further etching the semiconductor substrate between the first spacers to form a trench connected to the groove and define lower portions of the active regions; forming a device isolation layer in the trench; forming second spacers on outer sidewalls of the first spacers above the device isolation layer; forming a control gate conductive layer on the semiconductor substrate having the second spacers; and sequentially patterning the control gate conductive layer and the floating gate patterns to form a control gate line running across the active regions and to form floating gates interposed between the control gate line and the active regions.

Prior to the forming of the device isolation layer, the method may further include curing sidewalls of the lower region of the active region exposed within the trench to round an upper edge of the upper region of the active region. The curing may be performed using an $N_2$ plasma annealing technique or a thermal oxidation technique.

In the method, the first spacers may be a thermal oxide layer formed by thermally oxidizing the sidewalls of the floating gate patterns and the sidewalls of the upper portions of the active regions. The second spacers may include a silicon nitride layer. The control gate line may include an extending portion filling a gap between the floating gates adjacent to each other, the extending portion of the control gate line having a bottom surface which is lower than a bottom surface of the floating gate.

Prior to the forming of the second gate conductive layer, the method may further include etching the device isolation layer between the second spacers to form a recess portion within the upper region of the device isolation layer. The control gate line may include an extending portion filling a gap between the floating gates adjacent to each other, the extending portion of the control gate line having a bottom surface which is lower than a bottom surface of the floating gate.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A semiconductor memory device comprising:
   a device isolation layer formed in a semiconductor substrate to define a plurality of active regions;
   floating gates disposed on the active regions;
   a control gate line overlapping top surfaces of the floating gates and crossing over the active regions, the control gate line having an extending portion disposed in a gap between adjacent ones of the floating gates, the extending portion overlapping sidewalls of the adjacent ones of the floating gates;
   first spacers disposed on sidewalls of the adjacent ones of the floating gates, wherein each of the first spacers extends along a sidewall of the active region and along a sidewall of the device isolation layer; and
   second spacers disposed between outer sidewalls of the first spacers and the extending portion of the control gate line, wherein each of the second spacers is disposed above the device isolation layer.

2. The semiconductor memory device of claim 1, wherein each of the first spacers is formed on a sidewall of an upper portion of the active region, wherein a width of the upper portion of the active region is less than a width of a lower portion of the active region and wherein a step is formed between the upper portion of the active region and the lower portion of the active region.

3. The semiconductor memory device of claim 2, wherein an outer edge of the lower portion of the active region is rounded.

4. The semiconductor memory device of claim 2, wherein the width of the upper portion of the active region is substantially the same as a width of the floating gate.

5. The semiconductor memory device of claim 2, wherein each of the first spacers has a bottom surface located lower than a channel formed below the floating gate in a device operation and above a bottom portion of a source/drain region formed in the active region adjacent to the floating gate.

6. The semiconductor memory device of claim 1, wherein the first spacers comprise thermal oxide.

7. The semiconductor memory device of claim 1, wherein the second spacers comprise silicon nitride.

8. The semiconductor memory device of claim 1, wherein a bottom surface of the extending portion of the control gate line is lower than a bottom surface of the floating gate.

9. The semiconductor memory device of claim 8, wherein a top surface of the device isolation layer is substantially coplanar with or lower than a top surface of the active region.

10. The semiconductor memory device of claim 1, wherein the device isolation layer further comprises a recess portion at an upper portion thereof and wherein the extending portion of the control gate line is disposed within the recess portion.

11. The semiconductor memory device of claim 10, wherein a bottom surface of the recess portion is substantially coplanar with or lower than a top surface of the active region.

12. An electronic device comprising:
   a semiconductor memory device; and
   a controller electrically connected to the nonvolatile memory device,
   wherein the semiconductor memory device comprises:
      a device isolation layer formed in a semiconductor substrate to define a plurality of active regions;
      floating gates disposed on the active regions;
      a control gate line overlapping top surfaces of the floating gates and crossing over the active regions, the control gate line having an extending portion disposed in a gap between adjacent ones of the floating gates, the extending portion overlapping sidewalls of the adjacent ones of the floating gates;
      first spacers disposed on sidewalls of the adjacent ones of the floating gates, wherein each of the first spacers extends along a sidewall of the active region and along a sidewall of the device isolation layer; and
      second spacers disposed between outer sidewalls of the first spacers and the extending portion of the control gate line, wherein each of the second spacers is disposed above the device isolation layer.

* * * * *